Figure 1:
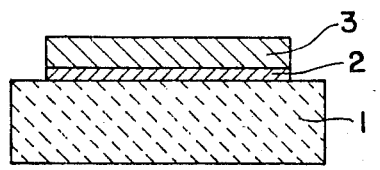

United States Patent [19]

Honjo et al.

[11] Patent Number: 4,559,279

[45] Date of Patent: Dec. 17, 1985

[54] ELECTRODE ON HEAT-RESISTING AND ISOLATING SUBSTRATE

[75] Inventors: Katsuhiko Honjo, Takatsuki; Hiromitsu Taki; Noriya Sato, both of Miyazaki, all of Japan

[73] Assignee: Matsushita Electric Industrial Co., Ltd., Osaka, Japan

[21] Appl. No.: 697,893

[22] Filed: Feb. 1, 1985

Related U.S. Application Data

[60] Division of Ser. No. 509,594, Jun. 30, 1983, Pat. No. 4,510,179, which is a continuation of Ser. No. 293,981, Aug. 18, 1981, abandoned.

[51] Int. Cl.⁴ .......................... C23C 3/00; C23C 3/02
[52] U.S. Cl. .................................. 428/632; 428/652; 428/668; 428/669; 428/671; 428/673
[58] Field of Search ............... 428/632, 652, 668, 669, 428/671, 673

[56] References Cited

U.S. PATENT DOCUMENTS

| | | | |
|---|---|---|---|
| 3,322,881 | 5/1967 | Schneble | 427/98 |
| 3,382,067 | 5/1968 | Sandstede et al. | 428/673 |
| 3,947,333 | 3/1976 | Bianchi et al. | 428/673 |
| 3,992,279 | 11/1976 | Larsson | 428/673 |
| 4,011,087 | 3/1977 | Short | 427/96 |
| 4,150,995 | 4/1979 | Moritsu | 427/304 |
| 4,196,029 | 4/1980 | Privas | 427/98 |
| 4,340,618 | 7/1982 | Fury | 427/98 |
| 4,416,916 | 11/1983 | Aykau et al. | 428/632 |

FOREIGN PATENT DOCUMENTS 52-53732 4/1977 Japan .................. 427/125

*Primary Examiner*—Veronica O'Keefe
*Attorney, Agent, or Firm*—Wenderoth, Lind & Ponack

[57] ABSTRACT

This invention provides an electrode on a heat-resisting and isolating substrate which is low-priced and has a stable character and the manufacturing process therefor. A paste which comprises 0.05 to 40 weight % of a metal material containing silver component of 0.5 to 100 weight % the remaining weight % of an organic vehicle, is formed on the substrate, and is heated at temperatures of 250° to 900° C. and consequently a metallic particle layer of 0.05 to 2 microns in thickness is formed on the substrate, and then an electrode of nickel and copper of 0.1 to 20 microns in thickness is built up on it by electroless plating.

8 Claims, 4 Drawing Figures

ELECTRODE ON HEAT-RESISTING AND ISOLATING SUBSTRATE

This application is a division of Ser. No. 509,594, filed June 30, 1983, now U.S. Pat. No. 4,510,179, which is a continuation of Ser. No. 293,981, filed Aug. 18, 1981 now abandoned.

This invention relates to an electrode on a heat-resisting and isolating substrate which is low-priced and has a stable character, and an improved process for its production.

The prior art, a metal glazing electrode consisting mainly of high priced metals such as Ag, Ag-Pd, Ag-Pt, Ag-Ni was used as electrode on heat-resisting and isolating substrate.

When such silver electrodes were used in surroundings where a potential difference was loaded across neighboring electrodes in high humidity, failure resulted wherein the electrodes short-circuited and what is called "a migration of silver" occurred. Further, there was another problem wherein the silver electrode was scavenged by soldering.

Further, recently, the traditional silver electrode cost became high due to a sudden rise in the price of the metal.

On the other hand, various electrodes formed by plating were watched with interest as metal prices rose. Plating electrodes have been made generally by an electroless plating method. In this method, a substrate was immersed in stannous chloride solution so as to be sensitized and was immersed in palladium chloride solution so as to be activated and then was plated electrolessly.

However, the traditional electrode formed by electroless plating adhered weakly to the substrate, and its electric character became worse (by life test). Further, this electrode had also a fault in the manufacturing method for it. For example, when the method by the electroless plating was adapted to electrodes on dielectric, piezoelectric and semiconductor substrates and so on, plating electrodes were formed on all surfaces of the substrate. Then, the electrode was struck off along the circumference, and was formed face to face.

In this case, resistant voltage was decided by the thickness of the substrate and a destruction of isolation was easily caused with concentration of electricity at the circumference edge of the electrode. Therefore, excessively thin substrates could not be used.

Against the problem of this manufacturing method, some methods of partial plating were proposed. For example, a metal film was formed partially on a surface on a ceramic substrate, the substrate formed a plating resist so only necessary places were activated and a metal film of electroless plating was formed at places except the resist places after the resist was removed.

Moreover, there were etching methods, vacuum evaporation methods, and sputtering methods as other methods of partial plating. However, these methods were not fully satisfactory, because the electrode formed by these methods did not adhere closely to the substrate and had a bad character and was not preferred from the point of view of production and price.

Therefore, an object of the present invention is to provide an excellent and stable electrode on a heat-resisting and isolating substrate.

Another object of the invention is to provide a novel and improved process which can be carried out easily with low cost.

In accordance with these objects, the present invention is based on the discovery of an electrode on a substrate which consists of a metallic layer containing silver component produced by heat-treatment and an electroless plating layer thereof closely adhering to the substrate and possessing a good character and having an excellent merit as to manufacturing process.

Figure 2:
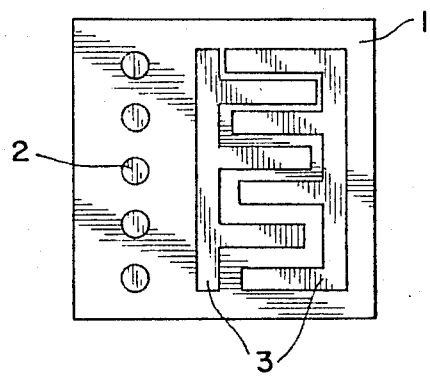
Figure 3A:
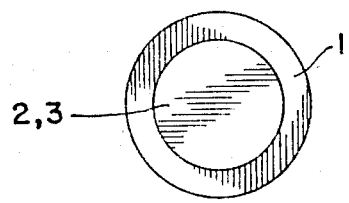
Figure 3B:
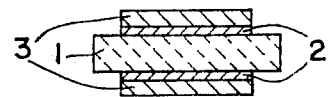

These and other objects, and the composition of the present invention will be detailed hereinafter, with the aid of the accompanying drawings in which:

FIG. 1 is a sectional view of the electrode on heat-resisting and isolating substrate according to this invention. In FIG. 1, 1 shows the heat-resisting and isolating substrate, 2 shows the metallic layer comprising silver component, and 3 shows the electroless plating layer; and FIG. 2 is a pattern of the electrode on alumina substrate. In FIG. 2, 1 shows the alumina substrate, 2 shows the electrode for measuring adhesive strenght, and 3 shows the electrode for testing silver migration;

FIG. 3A is a top plan view and FIG. 3B is a sectional view of the electrode on a dielectric ceramic substrate. In FIG. 3, 1 shows the dielectric ceramic substrate, 2 shows the metallic layer comprising silver component, and 3 shows the electroless plating layer.

According to the present invention, an electrode on heat-resisting and isolating substrate is produced by the following process. That is, a paste which comprises 0.05 to 40 weight% of a metal material containing silver component of 0.5 to 100 weight% and the remaining weight% of a organic vehicle, is formed on the substrate, and is heated at temperatures of 250° to 900° C. thus forming a metallic layer on the substrate and then an electrode of nickel and copper of 0.1 to 20 microns in thickness is built up on it by electroless plating.

In the process of this invention, as the silver component comprised in the metal material of the paste, a silver powder or a silver compound such as silver nitrate, silver carbonate, silver chloride which deposits a metallic silver by heat-treatment is used.

The silver component is adapted for the object of this invention because it forms easily metallic silver and is seldom oxidized and is cheap in metal price.

The metallic component except silver consists of simple metal and alloys of other price metals and base metals. As the metallic component, base metals such as copper, aluminium, zinc, tin, tungsten, molybdenum, iron, cobalt, chromium and paticularly nickel are desirable.

The powder of silver and base metal should be under 2 microns in diameter. When over 2 microns in diameter, adhesion of the electrode, electric character and printing character of the paste are bad.

Then, the component ratio of silver and base metal is 0.5 to 100 weight% of silver and 0 to 99.5 weight% of the base metal. However, the a component constituted by silver of 5 to 80 weight% and the base metal of 95 to 20 weight% is more desiable.

This is because, when the silver component is too much less than the base metal component, the metal layer formed is easily oxidized in heat-treatment and the layer formed by the electroless plating is not uniformly formed and, as a result, adhesion and electric character of the electrode are bad. Also, if the amount of silver component is excessive the electrode formed is not desirable because of low adhesion.

Further, addition of a palladium component of 0.01 to 5 weight% in the above metallic component makes for a strong activation ability for the electroless plating, and forms easily a uniform plating electrode and improves adhesion and electric character.

The amount of the metal material in the paste is 0.05 to 40 weight%. If it is too little, the uniform deposition by the electroless plating is very difficult and adhesive strength of the electrode is weak. Conversely, if it is too much, the electrode formed is bad in adhesion and electric character and is costly. Accordingly, the preferable amount of the metal material is 5 to 30 weight%.

According to this invention, an addition of 0.5 to 5 weight% of glass powder and low-melting oxide such as $Bi_2O_3$, $B_2O_3$, $Sb_2O_3$, $PbO$, in the paste can improve adhesion of the electrode, and $B_2O_3$ can restrain the oxidation of active metal for electroless plating. Therefore, the glass powder containing $B_2O_3$ is also preferable. These additives are not sufficiently effective at amounts under 0.5 weight% and conversely, have bad influence on adhesion and electric character of the electrode when over 5 weight%.

As customary silver paste of the fusing type is a major component of silver powder, printing accuracy of the paste is good. However, the more the resin composition in the paste, the worse printing accuracy becomes for an extension of the paste.

On the other hand, as the paste of this invention comprises less metallic composition, an extension of the paste is easy. But, it is found that if 1 to 30 weight% of a carbon powder and an inorganic powder such as $SiO_2$, $MgO$, $CaO$ and clay of 2 microns in diameter are added to the paste, extension of the paste can be efficiently prevented, and the paste does not influence the other characters.

The minimum of the added quantity is the volume to produce the preceding efficiency, and the maximum is the volume subject to restrictions of uniform deposition from electroless plating, strength of the adhesion, and electric character.

According to this invention, after the paste is painted at the necessary places on the heat-resisting and isolating substrate by a printing method or spray painting method and dried, the substrate is heated at temperatures of 250° to 900° C.

The reason for heat-treatment is to make a stable layer of metallic particle on a surface of the substrate. That is, if the temperature of heat-treatment is lower than the said limit, it is difficult to form safely the uniform layer of metallic particle due to residue of the resin component. Then, adhesion and electric character of the electrode formed becomes bad. If the temperature is higher than the said limit, a uniform layer of metallic particle cannot be formed due to fusion or oxidation of metal, and so adhesion and electric character of the electrode formed are bad. Therefore, for the said reason the optimum temperature is 350° to 600° C.

In this invention, if the thickness of the metallic particle layer formed on the substrate by heat-treatment is uniform and between 0.05 to 2 microns, functioning as an activated layer for electroless plating is adequate.

However, the customary silver electrode of fusing type is formed with thick film of about 5 to 20 microns of silver and can function as the electrode in itself. The thin metallic layer of the present invention cannot function as the electrode in itself and cannot be soldered in itself. Namely, the thin metallic layer of this invention cannot function as the electrode and be soldered until the electroless plating layer is deposited on it. Therefore, the metallic layer is quite different from the customary silver electrode of the fusing type.

Then, if the thickness of the metallic layer is thinner than the preceding limit, a plating layer is formed non-ununiformly and the character of the electrode is bad. If the metallic layer is too thick, an electrode formed by the electroless plating is indistinct in outline, and is not only weakened in strength of adhesion and electric character but also produces what is called "silver migration" under the life test wherein a voltage in loaded across each electrode in high humidity.

Further, the metallic particle layer as thick as the customary silver electrode is not desirable due to its of high cost. Therefore, the thickness of this metallic layer is best between 0.2 to 1 micron. Then, in the case of heat-treatment of small ceramic condensers, a good accuracy of the metallic layer can be gained by heating in a cloud of inorganic material such as alumina of 0.1 to 10 mm in diameter.

In this invention, an electroless plating of copper and nickel is preferred in point of its electric character, soldering character and mass-produceability.

The electroless copper plating bath composition comprises chiefly a soluble copper compound, a cupric complexing agent, alkaline compound and formaldehyde as reduction agent. The electroless nickel plating bath comprises generally nickel sulfate and phosphite as the reduction reagent. A bath containing boron compound as reduction reagent is preferred for soldering.

According to this invention, the thickness of the electroless plating layer is 0.1 to 20 microns. The minimum of the thickness is the value to produce efficiency as electrode and the maximum is the value restricted by character and cost, and therefore, the best range of the thickness is between 1 to 10 microns. If the metallic layer formed by heat-treatment is treated in solution which contains at least a kind of Pd ion, Pt ion, Os ion, Ir ion, Ru ion, before electroless plating, it becomes active for electroless plating reaction and a uniform plating electrode is formed. Futher, if the metallic layer is treated in a solution which contains one or a mixture of organic acid, ammonia solution, nitric acid and sulfuric acid, before the said substitution treatment by the solution such as Pd ion, the accuracy in the measure of the plating electrode is improved.

In this invention, the heat-resisting and isolating substrate must be heat-resisting over the temperature of 250° C., and ceramic substrate is preferable.

If the surface of the substrate is roughened by chemical or mechanical treatment, strength of adhesion of the electrode and electric character is improved.

A cross section structure of the electrode on the heat-resisting and isolating substrate which is produced by this invention is indicated in FIG. 1. That is, in FIG. 1, 1 is a heat-resisting and isolating substrate, 2 is a metal layer comprising silver component, and 3 is an electroless plating layer.

It is thought that these electrodes on the heat-resisting and isolating substrates which are produced by this invention will be adopted for use as electrodes of conductor circuits, condensers, piezoelectrics and so on.

EXAMPLE 1

Alumina substrate of 50 mm×50 mm in shape and 1 mm in thickness which was etched in mixed solution of fluoric acid and nitric acid was used as the heat-resisting and isolating substrate.

The paste which is printed on the said substrate was made with the composition 0.05 to 40 weight % of the metal material comprising silver component of 0 to 100 weight % and base metal of 100 to 0 weight %, and the remainder organic vehicle.

As the said silver component, silver powder under 1 micron in average diameter, and silver nitrate were used.

As the said base metal, a metallic powder such as Ni, Cu, Al, Zu, Sn, W, Mo, Fe, Co, Cr, under an average of 2 microns in diameter was used.

As the said organic vehicle, a resin such as ethyl cellulose, acetic cellulose, butyl rubber, poly-vinyl-butyral, phenol, and a solvent such as calbytol, terpineol, cellosolve, and alcohol was used.

The component of glass powder which was used as added reagent was as follows: glass powder (A) composed PbO, $B_2O_3$, $Al_2O_3$, $Na_2O$; glass powder (B) composed $B_2O_3$, $Na_2O$, CaO, ZnO; glass powder (C) composed $Na_2O$, $P_2O_3$, CaO ZnO, $B_2O_3$.

This paste was printed along the pattern indicated in FIG. 2 on the alumina substrate and was dried at temperatures of 100° to 120° C., and the metallic particle layer was formed with heat-treatment at a temperature of 200° to 900° C. by electric hearth.

After this substrate was immersed in palladium ion solution of 0.01%, a copper and nickel layer of 0.1 to 20 microns in thickness was formed on the substrate by electroless plating.

The electroless copper plating bath was provided with a component of copper sulfate, EDTA as complexing reagent, formaldehyde as reduction reagent, sodium hydroxide as pH regulator and additive reagent. Then the electroless copper plating was carried out in the bath kept at the temperature of 70° to 75° C. The electroless nickel plating bath was provided with a component of nickel sulfate, sodium citrate as complexing agent, sodium phosphite as reducing agent. Then, the plating was carried out in the bath kept at temperatures of 88° to 92° C.

On the occasion of measurement of adhesive strength of the electrode, and electrode of 5 mm in diameter on the substrate was prepared, as shown in FIG. 2 at 2, and was soldered with wire 0.5 mm in diameter.

In the silver migration test, voltage of 10 V was loaded between both ends of the electrode with a pattern as shown in FIG. 2 at 3. The test was carried out at temperature of 60° C. in relative humidity of 95% for 1000 hours. And after the test, silver migration was observed.

As an example of the traditional electroless plating electrode, the substrate was activated by immersion in stannous ion solution and palladium ion solution and electroless nickel plating electrode of 5 mm in diameter on the substrate was formed by the masking resist method.

As an example of the traditional silver electrode of fusing type, a silver paste was printed on the substrate along the pattern of FIG. 2 at 2 and FIG. 2 at 3, and was dried at 120° C. for 10 minutes, and was heat-treated at 860° C. for 10 minutes.

These results are shown in Table 1.

In the Table, an estimate of the state of electroless plating deposition is shown, that is, a sign of 'O' shows good; a sign of 'Δ' shows a little good; and a sign of 'X' shows bad.

In an item of Ag migration, a sign of 'Yes' shows growing of Ag migration, and a sign of 'No' shows no occuring of Ag migration.

A sign of 'O' at 'No' of sample shows referenced example.

EXAMPLE 2

A ceramic substrate of dielectric of 4 1 to 10 mm in diameter and 0.15 to 1 mm in thickness composed of $BaTiO_3$ $BaZrO_3$, and $CaTiO_3$ which was etched in a mixed solution of fluoric acid and nitric acid was used as the heat-resisting and isolating substrate.

As a paste, the same that was used in Example 1 was prepared. The paste was printed along the pattern of FIG. 3 with printing mask so as to leave uniformly an edge of 0.5 to 1 mm on each face of the substrate.

Subsequent treatment and measurement of adhesive strength were identical with Example 1.

As a measure of dielectric character, $\epsilon$ and tan $\delta$ in the first stage and after a life test for 1000 hours at a of temperature of 85° C. relative humidity of 85%, were measured at a temperature of 20° C., by 20 KHz with a capacitance bridge.

These results are shown in Table 2.

In Table 2, an estimate of the state of electroless plating deposition is identified by using the same signs used in Table 1. Also, a sign of 'O' at 'No' of sample shows referenced example.

So as to make clear by the preceding explanation and the result in the Table, the electrode on the heat-resisting and isolating substrate formed by this invention is preferable in character and lower in price than the traditional silver electrode of fusing type, and is preferable in character and more adapted in industrial mass production for easy manufacturing than the electroless nickel plating electrode by the traditional method.

Therefore, the electrode on the heat-resisting and isolating substrate and the manufacturing process of this invention is of high value to industry.

TABLE 1

| Sample No. | Ratio of metal component - Ag component wt % | Ratio of metal component - Base metal component wt % | Metal composition in paste wt % | Amount of added agent in paste wt % | Temperature of heat-treatment °C. | Averaged thickness of metal layer after heat-treatment μ | Thickness of electroless plating μ | State of electroless plating deposit | Accuracy of measure after plating deposition μ | Strength of adhesion after soldering electrode of 5φ lead wire of 0.5φ Kg. | Item of Ag migration 60° C., 95% RH 10V 1000 Hrs. | Remarks |
|---|---|---|---|---|---|---|---|---|---|---|---|---|
| 1 | 100 | 0 | 10 | — | 450 | 0.5 | 3 (Ni) | o~Δ | +70~+100 | 0.6 | No | |
| 2 | 80 | 20 (Ni) | 10 | — | 450 | 0.5 | 3 (Ni) | o | +50~+80 | 2.6 | No | |
| 3 | 60 | 40 (Ni) | 10 | — | 450 | 0.5 | 3 (Ni) | o | +50~+80 | 3.3 | No | |
| 4 | 40 | 60 (Ni) | 10 | — | 450 | 0.5 | 3 (Ni) | o | +40~+60 | 3.6 | No | |
| 5 | 20 | 80 (Ni) | 10 | — | 450 | 0.5 | 3 (Ni) | o | +30~+50 | 3.8 | No | |
| 6 | 10 | 90 (Ni) | 10 | — | 450 | 0.5 | 3 (Ni) | o | +30~+50 | 3.2 | No | |
| 7 | 5 | 95 (Ni) | 10 | — | 450 | 0.5 | 3 (Ni) | o | +30~+50 | 2.7 | No | |
| 8 | 0.5 | 99.5 (Ni) | 10 | — | 450 | 0.5 | 3 (Ni) | o~Δ | +20~+40 | 1.0 | No | |
| ⑨ | 0 | 100 (Ni) | 10 | — | 450 | 0.5 | 3 (Ni) | o~x | +10~+30 | 0.2 | No | |
| ⑩ | 20 | 80 (Ni) | 0.02 | — | 450 | 0.02 | — | — | — | — | — | |
| 12 | 20 | 80 (Ni) | 0.05 | — | 450 | 0.05 | 3 (Ni) | Δ | +120~+200 | 0.4 | No | |
| 13 | 20 | 80 (Ni) | 0.5 | — | 450 | 0.1 | 3 (Ni) | o~Δ | +100~+200 | 0.5 | No | |
| 14 | 20 | 80 (Ni) | 1 | — | 450 | 0.1 | 3 (Ni) | o~Δ | +100~+200 | 0.9 | No | |
| 15 | 20 | 80 (Ni) | 5 | — | 450 | 0.2 | 3 (Ni) | o | +80~+160 | 2.7 | No | |
| 16 | 20 | 80 (Ni) | 20 | — | 450 | 0.7 | 3 (Ni) | o | +40~+60 | 3.6 | No | |
| 17 | 20 | 80 (Ni) | 30 | — | 450 | 1.0 | 3 (Ni) | o | +20~+50 | 3.3 | No | |
| 18 | 20 | 80 (Ni) | 30 | — | 450 | 1.5 | 3 (Ni) | o | +80~+150 | 1.5 | No | |
| 19 | 20 | 80 (Ni) | 40 | — | 450 | 2 | 3 (Ni) | o | +100~+300 | 1.1 | No | |
| 20 | 20 | 80 (Ni) | 60 | — | 450 | 4 | 3 (Ni) | o | +180~+300 | 0.3 | No | |
| 21 | 100 | 0 | 0.05 | — | 450 | 0.05 | 3 (Ni) | o~Δ | +150~+250 | 0.6 | No | Only Ag compound |
| 22 | 100 | 0 | 1 | 20 (carbon) | 450 | 0.1 | 3 (Ni) | o~Δ | +150~+250 | 0.9 | No | Only Ag compound |
| 23 | 100 | 0 | 15 | — | 450 | 0.5 | 3 (Ni) | o | +20~+30 | 1.0 | No | Only Ag compound 1 wt % / Ag compound 1 wt % |
| | | | | | | | | | +40~+70 | 2.7 | No | Ag powder 14 wt % |
| 24 | 20 | 80 (Cu) | 15 | — | 450 | 0.5 | 3 (Ni) | o | +100~+200 | 3.4 | No | |
| 25 | 20 | 80 (Al) | 15 | — | 450 | 0.5 | 3 (Ni) | o | +50~+80 | 3.2 | No | |
| 26 | 20 | 80 (Zn) | 15 | — | 450 | 0.5 | 3 (Ni) | o | +60~+80 | 3.0 | No | |
| 27 | 20 | 80 (Sn) | 15 | — | 450 | 0.5 | 3 (Ni) | o | +50~+70 | 3.4 | No | |
| 28 | 20 | 80 (W) | 15 | — | 450 | 0.5 | 3 (Ni) | o | +40~+70 | 3.0 | No | |
| 29 | 20 | 80 (Mo) | 15 | — | 450 | 0.5 | 3 (Ni) | o | +30~+80 | 3.0 | No | |
| 30 | 20 | 80 (Fe) | 15 | — | 450 | 0.5 | 3 (Ni) | o | +50~+80 | 3.2 | No | |
| 31 | 20 | 80 (Co) | 15 | — | 450 | 0.5 | 3 (Ni) | o | +40~+70 | 3.6 | No | |
| 32 | 20 | 80 (Cr) | 15 | — | 450 | 0.5 | 3 (Ni) | o | +60~+80 | 3.1 | No | |
| 33 | 20 | 80 (Ni) | 15 | — | 450 | 0.5 | 3 (Ni) | o | +30~+50 | 3.7 | No | |
| 34 | 20 | 79.9 (Ni) | 15 | — | 450 | 0.5 | 3 (Ni) | o | +20~+50 | 3.8 | No | |
| 35 | 20 | 79.8 (Ni) | 15 | — | 450 | 0.5 | 3 (Ni) | o | +20~+40 | 3.9 | No | |
| 36 | 20 | 79.5 (Ni) | 15 | — | 450 | 0.5 | 3 (Ni) | o | +30~+40 | 4.0 | No | |
| 37 | 20 | 75 (Ni) | 15 | — | 450 | 0.5 | 3 (Ni) | o | +30~+60 | 3.5 | No | |
| ㊳ | 20 | 80 (Ni) | 15 | — | 180 | 0.5 | — | — | — | — | — | |
| 39 | 20 | 80 (Ni) | 15 | — | 250 | 0.5 | 3 (Ni) | o~Δ | +50~+80 | 0.3 | No | |
| 40 | 20 | 80 (Ni) | 15 | — | 300 | 0.5 | 3 (Ni) | Δ | +50~+70 | 0.8 | No | |
| 41 | 20 | 80 (Ni) | 15 | — | 350 | 0.5 | 3 (Ni) | o | +60~+80 | 3.3 | No | Pd powder 0.01 wt % |
| 42 | 20 | 80 (Ni) | 15 | — | 400 | 0.5 | 3 (Ni) | o | +50~+80 | 3.7 | No | Pd powder 0.1 wt % |
| 43 | 20 | 80 (Ni) | 15 | — | 600 | 0.5 | 3 (Ni) | o | +60~+90 | 3.4 | No | Pd powder 0.2 wt % |
| 44 | 20 | 80 (Ni) | 15 | — | 800 | 0.5 | 3 (Ni) | o | +40~+60 | 1.8 | No | Pd powder 0.5 wt % / Pd powder 5 wt % |

TABLE 1-continued

| Sample No. | Ratio of metal component - Ag component wt % | Ratio of metal component - Base metal component wt % | Metal composition in paste wt % | Amount of added agent in paste wt % | Temperature of heat-treatment °C. | Averaged thickness of metal layer after heat-treatment μ | Thickness of electroless plating μ | State of electroless plating deposit | Accuracy of measure after plating deposition μ | Strength of adhesion after soldering electrode of 5φ lead wire of 0.5φ Kg. | Item of Ag migration 60° C., 95% RH 10V 1000 Hrs. | Remarks |
|---|---|---|---|---|---|---|---|---|---|---|---|---|
| 45 | 20 | 80 (Ni) | 15 | — | 900 | 0.5 | 3 (Ni) | Δ | +40~+60 | 0.5 | No | |
| 46 | 20 | 80 (Ni) | 15 | — | 1050 | 0.5 | — | × | — | — | — | |
| 47 | 20 | 80 (Ni) | 15 | — | 450 | 0.5 | 0.02 (Ni) | × | — | — | — | |
| 48 | 20 | 80 (Ni) | 15 | — | 450 | 0.5 | 0.1 (Ni) | Δ | +30~+50 | 0.3 | No | |
| 49 | 20 | 80 (Ni) | 15 | — | 450 | 0.5 | 0.5 (Ni) | ○ | +40~+60 | 2.8 | No | |
| 50 | 20 | 80 (Ni) | 15 | — | 450 | 0.5 | 1 (Ni) | ○ | +40~+70 | 3.5 | No | |
| 51 | 20 | 80 (Ni) | 15 | — | 450 | 0.5 | 5 (Ni) | ○ | +60~+80 | 3.8 | No | |
| 52 | 20 | 80 (Ni) | 15 | — | 450 | 0.5 | 10 (Ni) | ○ | +60~+90 | 3.8 | No | |
| 53 | 20 | 80 (Ni) | 15 | — | 450 | 0.5 | 20 (Ni) | ○ | +70~+120 | 3.4 | No | |
| 54 | 20 | 80 (Ni) | 15 | 0.1 (B₂O₃) | 450 | 0.5 | 3 (Ni) | ○ | +40~+60 | 3.6 | No | |
| 55 | 20 | 80 (Ni) | 15 | 0.5 (B₂O₃) | 450 | 0.5 | 3 (Ni) | ○ | +40~+60 | 4.1 | No | |
| 56 | 20 | 80 (Ni) | 15 | 5 (B₂O₃) | 450 | 0.5 | 3 (Ni) | ○ | +30~+50 | 3.9 | No | |
| 57 | 20 | 80 (Ni) | 15 | 10 (B₂O₃) | 450 | 0.5 | 3 (Ni) | ○ | +30~+50 | 3.5 | No | |
| 58 | 20 | 80 (Ni) | 15 | 1 (Bi₂O₃) | 450 | 0.5 | 3 (Ni) | ○ | +40~+60 | 3.7 | No | |
| 59 | 20 | 80 (Ni) | 15 | 1 (Sb₂O₃) | 450 | 0.5 | 3 (Ni) | ○ | +40~+70 | 3.7 | No | |
| 60 | 20 | 80 (Ni) | 15 | 1 (PbO) | 450 | 0.5 | 3 (Ni) | ○ | +40~+70 | 3.8 | No | |
| 61 | 20 | 80 (Ni) | 15 | 1 (glass powder) | 550 | 0.5 | 3 (Ni) | ○ | +40~+60 | 4.1 | No | |
| 62 | 20 | 80 (Ni) | 15 | 1 (glass powder) | 500 | 0.5 | 3 (Ni) | ○ | +40~+60 | 4.1 | No | glass powder A |
| 63 | 20 | 80 (Ni) | 15 | 1 (glass powder) | 500 | 0.5 | 3 (Ni) | ○ | +40~+70 | 4.2 | No | glass powder B |
| 64 | 20 | 80 (Ni) | 15 | 1 (carbon) | 450 | 0.5 | 3 (Ni) | ○ | +30~+50 | 3.8 | No | glass powder C |
| 65 | 20 | 80 (Ni) | 15 | 10 (carbon) | 450 | 0.5 | 3 (Ni) | ○ | +10~+20 | 3.7 | No | carbon powder |
| 66 | 20 | 80 (Ni) | 15 | 30 (carbon) | 450 | 0.5 | 3 (Ni) | ○ | 0~+10 | 3.2 | No | carbon powder |
| 67 | 20 | 80 (Ni) | 15 | 50 (carbon) | 450 | 0.5 | 3 (Ni) | Δ | +10~+20 | 0.9 | No | carbon powder |
| 68 | 20 | 80 (Ni) | 15 | 10 (SiO₂) | 450 | 0.5 | 3 (Ni) | ○ | +10~+30 | 3.6 | No | carbon powder |
| 69 | 20 | 80 (Ni) | 15 | 10 (MgO) | 450 | 0.5 | 3 (Ni) | ○ | +20~+30 | 3.6 | No | SiO₂ powder |
| 70 | 20 | 80 (Ni) | 15 | — | 450 | 0.5 | 3 (Ni) | ○ | +40~+60 | 0.6 | No | MgO powder |
| 71 | 20 | 80 (Ni) | 15 | — | 450 | 0.5 | 3 (Ni) | ○ | +30~+50 | 3.6 | No | no ething substrate |
| 72 | 20 | 80 (Ni) | 15 | — | 450 | 0.5 | 3 (Ni) | ○ | +30~+50 | 3.7 | No | H₂SO₄ treatment |
| 73 | 20 | 80 (Ni) | 15 | — | 450 | 0.5 | 3 (Ni) | ○ | +80~+150 | 2.0 | No | HNO₃ treatment |
| 74 | 20 | 80 (Ni) | 15 | — | 450 | 0.5 | 3 (Cu) | ○ | +50~+90 | 3.2 | No | 4μ > metal powder electroless copper plating |
| 75 | traditional electroless nickel plating electrode | | | | | | 3 (Ni) | ○ | | 0.5 | No | |
| 76 | traditional silver electrode of fusing type | | | | | | 5 (Ag) | — | — | 3.0 | Yes | |
| 77 | traditional silver electrode of fusing type | | | | | | 10 (Ag) | — | — | 3.3 | Yes | |
| 78 | traditional silver electrode of fusing type | | | | | | 20 (Ag) | — | — | 3.3 | Yes | |

TABLE 2

| Sample No. | Ratio of metal component Ag component wt % | Ratio of metal component Base metal component wt % | Metal composition in paste wt % | Amount of added agent in paste wt % | Temperature of heat-treatment °C. | Averaged thickness of metal layer after heat-treatment μ | Thickness of electroless plating μ | State of electroless plating deposit | Accuracy of measure after plating deposition μ | Strength of adhesion after soldering Kg. | Value in first stage (1 KHz, 20° C.) ε | Value in first stage tan δ ×10⁻⁴ | Value after life test 85° C., 85% RH 1000 Hrs. ε | Value after life test tan δ ×10⁻⁴ | Remarks |
|---|---|---|---|---|---|---|---|---|---|---|---|---|---|---|---|
| 1 | 100 | 0 | 10 | — | 450 | 0.5 | 3 (Ni) | o~Δ | +60~+90 | 1.0 | 19000 | 130 | 17600 | 168 | |
| 2 | 80 | 20 (Ni) | 10 | — | 450 | 0.5 | 3 (Ni) | o | +50~+80 | 3.4 | 20200 | 120 | 18400 | 162 | |
| 3 | 60 | 40 (Ni) | 10 | — | 450 | 0.5 | 3 (Ni) | o | +50~+80 | 4.2 | 20900 | 110 | 19050 | 140 | |
| 4 | 40 | 60 (Ni) | 10 | — | 450 | 0.5 | 3 (Ni) | o | +40~+70 | 4.5 | 21200 | 105 | 19500 | 132 | |
| 5 | 20 | 80 (Ni) | 10 | — | 450 | 0.5 | 3 (Ni) | o | +30~+60 | 4.6 | 21700 | 102 | 20100 | 127 | |
| 6 | 10 | 90 (Ni) | 10 | — | 450 | 0.5 | 3 (Ni) | o | +30~+50 | 4.0 | 21000 | 109 | 19200 | 138 | |
| 7 | 5 | 95 (Ni) | 10 | — | 450 | 0.5 | 3 (Ni) | o | +30~+50 | 3.4 | 20700 | 111 | 18800 | 136 | |
| ⑧ | 0.5 | 99.5 (Ni) | 10 | — | 450 | 0.5 | 3 (Ni) | o~Δ | +20~+40 | 1.7 | 18700 | 135 | 17500 | 156 | |
| ⑨ | 0 | 100 (Ni) | 10 | — | 450 | 0.5 | 3 (Ni) | Δ~x | +10~+30 | 0.4 | 16200 | 186 | 13800 | 420 | |
| ⑩ | 20 | 80 (Ni) | 0.02 | — | 450 | 0.02 | — | x | — | — | — | — | — | — | |
| 11 | 20 | 80 (Ni) | 0.05 | — | 450 | 0.05 | 3 (Ni) | Δ | +150~+250 | 0.6 | 16800 | 150 | 14800 | 220 | |
| 12 | 20 | 80 (Ni) | 0.5 | — | 450 | 0.1 | 3 (Ni) | o~Δ | +150~+250 | 0.8 | 18600 | 132 | 17200 | 172 | |
| 13 | 20 | 80 (Ni) | 1 | — | 450 | 0.1 | 3 (Ni) | o~Δ | +120~+200 | 1.5 | 19300 | 127 | 17900 | 165 | |
| 14 | 20 | 80 (Ni) | 5 | — | 450 | 0.2 | 3 (Ni) | o | +120~+180 | 3.5 | 21000 | 108 | 19300 | 137 | |
| 15 | 20 | 80 (Ni) | 20 | — | 450 | 0.7 | 3 (Ni) | o | +50~+70 | 4.5 | 21500 | 103 | 20000 | 127 | |
| 16 | 20 | 80 (Ni) | 30 | — | 450 | 1.0 | 3 (Ni) | o | +20~+40 | 4.1 | 21300 | 106 | 19600 | 130 | |
| 17 | 20 | 80 (Ni) | 30 | — | 450 | 1.5 | 3 (Ni) | o | +80~+150 | 2.2 | 20100 | 120 | 18300 | 162 | |
| ⑱ | 20 | 80 (Ni) | 40 | — | 450 | 2 | 3 (Ni) | o | +70~+130 | 1.5 | 19500 | 125 | 17700 | 166 | |
| ⑲ | 20 | 80 (Ni) | 60 | — | 450 | 4 | 3 (Ni) | Δ | +180~+300 | 0.7 | 17200 | 145 | 15300 | 210 | |
| 20 | 20 | 80 (Ni) | 0.05 | — | 450 | 0.05 | 3 (Ni) | o | +180~+300 | 1.0 | 17600 | 140 | 15200 | 200 | only Ag compound |
| 21 | 100 | 0 | 1 | — | 450 | 0.1 | 3 (Ni) | o~Δ | +150~+300 | 1.4 | 19200 | 125 | 17800 | 165 | only Ag compound |
| 22 | 100 | 0 | 1 | 20 (carbon) | 450 | 0.15 | 3 (Ni) | o~Δ | +10~+20 | 1.6 | 19400 | 122 | 18100 | 160 | only Ag compound |
| 23 | 100 | 0 | 15 | — | 450 | 0.5 | 3 (Ni) | o | +40~+70 | 3.5 | 19800 | 125 | 18000 | 165 | Ag compound 1 wt % Ag powder 14 wt % |
| 24 | 20 | 80 (Cu) | 15 | — | 450 | 0.5 | 3 (Ni) | o | +100~+200 | 4.1 | 20900 | 112 | 19500 | 139 | |
| 25 | 20 | 80 (Al) | 15 | — | 450 | 0.5 | 3 (Ni) | o | +50~+70 | 3.9 | 20700 | 112 | 19400 | 140 | |
| 26 | 20 | 80 (Zn) | 15 | — | 450 | 0.5 | 3 (Ni) | o | +60~+80 | 3.8 | 20700 | 114 | 19300 | 140 | |
| 27 | 20 | 80 (Sn) | 15 | — | 450 | 0.5 | 3 (Ni) | o | +60~+80 | 4.2 | 21300 | 106 | 19400 | 134 | |
| 28 | 20 | 80 (W) | 15 | — | 450 | 0.5 | 3 (Ni) | o | +40~+70 | 3.6 | 20000 | 122 | 18100 | 161 | |
| 29 | 20 | 80 (Mo) | 15 | — | 450 | 0.5 | 3 (Ni) | o | +40~+60 | 3.7 | 20100 | 118 | 18300 | 158 | |
| 30 | 20 | 80 (Fe) | 15 | — | 450 | 0.5 | 3 (Ni) | o | +50~+80 | 3.9 | 20500 | 113 | 19300 | 140 | |
| 31 | 20 | 80 (Co) | 15 | — | 450 | 0.5 | 3 (Ni) | o | +40~+70 | 4.4 | 21200 | 105 | 19200 | 133 | |
| 32 | 20 | 80 (Cr) | 15 | — | 450 | 0.5 | 3 (Ni) | o | +50~+80 | 3.7 | 20100 | 120 | 18100 | 157 | |
| ㉝ | 20 | 80 (Ni) | 15 | — | 180 | 0.5 | 3 (Ni) | x | — | — | — | — | — | — | |
| 34 | 20 | 80 (Ni) | 15 | — | 250 | 0.5 | 3 (Ni) | o~Δ | +60~+80 | 0.6 | 16800 | 160 | 14600 | 230 | |
| 35 | 20 | 80 (Ni) | 15 | — | 300 | 0.5 | 3 (Ni) | o | +60~+80 | 1.6 | 18800 | 137 | 17600 | 157 | |
| 36 | 20 | 80 (Ni) | 15 | — | 350 | 0.5 | 3 (Ni) | o | +60~+80 | 4.2 | 20700 | 112 | 19000 | 140 | |
| 37 | 20 | 80 (Ni) | 15 | — | 400 | 0.5 | 3 (Ni) | o | +50~+70 | 4.6 | 21600 | 103 | 20100 | 129 | |
| 38 | 20 | 80 (Ni) | 15 | — | 600 | 0.5 | 3 (Ni) | o | +60~+90 | 4.0 | 21200 | 108 | 19300 | 136 | |
| 39 | 20 | 80 (Ni) | 15 | — | 800 | 0.5 | 3 (Ni) | Δ | +50~+70 | 2.4 | 19900 | 119 | 18100 | 163 | |
| 40 | 20 | 80 (Ni) | 15 | — | 900 | 0.5 | 3 (Ni) | o | +40~+60 | 1.0 | 17300 | 142 | 15800 | 180 | |
| ㊶ | 20 | 80 (Ni) | 15 | — | 1050 | 0.5 | — | x | — | — | — | — | — | — | |
| ㊷ | 20 | 80 (Ni) | 15 | — | 450 | 0.5 | 0.02 (Ni) | x | — | — | — | — | — | — | |
| 43 | 20 | 80 (Ni) | 15 | — | 450 | 0.5 | 0.1 (Ni) | Δ | +30~+60 | 0.6 | 16900 | 160 | 14800 | 235 | |

TABLE 2-continued

| Sample No. | Ratio of metal component Ag component wt % | Ratio of metal component Base metal component wt % | Metal composition in paste wt % | Amount of added agent in paste wt % | Temperature of heat-treatment °C | Averaged thickness of metal layer after heat-treatment μ | Thickness of electro-less plating μ | State of electro-less plating deposit | Accuracy of measure after plating deposition μ | Strength of adhesion after soldering Kg. | Dielectric character (1 KHz, 20° C.) Value in first stage ε | Dielectric character (1 KHz, 20° C.) Value in first stage tan δ ×10⁻⁴ | Value after life test 85° C., 85% RH 1000 Hrs. ε | Value after life test 85° C., 85% RH 1000 Hrs. tan δ ×10⁻⁴ | Remarks |
|---|---|---|---|---|---|---|---|---|---|---|---|---|---|---|---|
| 44 | 20 | 80 (Ni) | 15 | — | 450 | 0.5 | 0.5 (Ni) | ○ | +30~+60 | 3.5 | 21100 | 110 | 19400 | 138 | |
| 45 | 20 | 80 (Ni) | 15 | — | 450 | 0.5 | 1 (Ni) | ○ | +30~+60 | 4.2 | 21400 | 107 | 19600 | 130 | |
| 46 | 20 | 80 (Ni) | 15 | — | 450 | 0.5 | 5 (Ni) | ○ | +50~+70 | 4.7 | 21500 | 103 | 20000 | 128 | |
| 47 | 20 | 80 (Ni) | 15 | — | 450 | 0.5 | 10 (Ni) | ○ | +60~+80 | 4.8 | 21200 | 108 | 19500 | 133 | |
| 48 | 20 | 80 (Ni) | 15 | — | 450 | 0.5 | 20 (Ni) | ○ | +80~+120 | 4.2 | 21200 | 112 | 19300 | 140 | |
| 49 | 20 | 80 (Ni) | 15 | 0.1 (B₂O₃) | 450 | 0.5 | 3 (Ni) | ○ | +40~+60 | 4.4 | 21400 | 104 | 19300 | 130 | |
| 50 | 20 | 80 (Ni) | 15 | 0.5 (B₂O₃) | 450 | 0.5 | 3 (Ni) | ○ | +40~+60 | 5.0 | 21800 | 102 | 19200 | 130 | |
| 51 | 20 | 80 (Ni) | 15 | 5 (B₂O₃) | 450 | 0.5 | 3 (Ni) | ○ | +40~+60 | 4.8 | 21900 | 110 | 19100 | 135 | |
| 52 | 20 | 80 (Ni) | 15 | 10 (B₂O₃) | 450 | 0.5 | 3 (Ni) | ○ | +30~+50 | 4.0 | 21000 | 110 | 17900 | 148 | |
| 53 | 20 | 80 (Ni) | 15 | 1 (Bi₂O₃) | 450 | 0.5 | 3 (Ni) | ○ | +40~+60 | 4.7 | 21200 | 105 | 19200 | 130 | |
| 54 | 20 | 80 (Ni) | 15 | 1 (Sb₂O₃) | 450 | 0.5 | 3 (Ni) | ○ | +40~+70 | 4.8 | 21100 | 107 | 19000 | 132 | |
| 55 | 20 | 80 (Ni) | 15 | 1 (PbO) | 450 | 0.5 | 3 (Ni) | ○ | +40~+70 | 4.9 | 21100 | 106 | 19100 | 131 | |
| 56 | 20 | 80 (Ni) | 15 | 1 (glass powder) | 550 | 0.5 | 3 (Ni) | ○ | +40~+60 | 5.2 | 21800 | 105 | 19500 | 125 | glass powder A |
| 57 | 20 | 80 (Ni) | 15 | 1 (glass powder) | 500 | 0.5 | 3 (Ni) | ○ | +40~+60 | 5.0 | 21600 | 103 | 19400 | 127 | glass powder B |
| 58 | 20 | 80 (Ni) | 15 | 1 (glass powder) | 500 | 0.5 | 3 (Ni) | ○ | +40~+60 | 5.1 | 21500 | 102 | 19400 | 125 | glass powder C |
| 59 | 20 | 80 (Ni) | 15 | 1 (carbon) | 450 | 0.5 | 3 (Ni) | ○ | +30~+60 | 4.7 | 21400 | 104 | 20100 | 129 | carbon powder |
| 60 | 20 | 80 (Ni) | 15 | 10 (carbon) | 450 | 0.5 | 3 (Ni) | ○ | ±0~+20 | 4.6 | 21500 | 105 | 20200 | 130 | carbon powder |
| 61 | 20 | 80 (Ni) | 15 | 30 (carbon) | 450 | 0.5 | 3 (Ni) | ○ | +10~−10 | 4.0 | 21000 | 110 | 19200 | 137 | carbon powder |
| 62 | 20 | 80 (Ni) | 15 | 50 (carbon) | 450 | 0.5 | 3 (Ni) | △ | +10~+20 | 1.5 | 18100 | 140 | 16200 | 159 | carbon powder |
| 63 | 20 | 80 (Ni) | 15 | 10 (SiO₂) | 450 | 0.5 | 3 (Ni) | ○ | +15~+30 | 4.5 | 21300 | 108 | 19500 | 132 | SiO₂ powder |
| 64 | 20 | 80 (Ni) | 15 | 10 (MgO) | 450 | 0.5 | 3 (Ni) | ○ | +40~+30 | 4.4 | 21200 | 109 | 19500 | 130 | MgO powder |
| 65 | 20 | 80 (Ni) | 15 | — | 450 | 0.5 | 3 (Ni) | ○ | +40~+60 | 1.3 | 19500 | 135 | 17700 | 160 | no etching of substrate |
| 66 | 20 | 80 (Ni) | 15 | — | 450 | 0.5 | 3 (Ni) | ○ | +30~+50 | 4.5 | 21500 | 102 | 20200 | 127 | H₂SO₄ treatment |
| 67 | 20 | 80 (Ni) | 15 | — | 450 | 0.5 | 3 (Ni) | ○ | +30~+60 | 4.6 | 21600 | 102 | 20100 | 129 | HNO₃ treatment |
| 68 | 20 | 80 (Ni) | 15 | — | 450 | 0.5 | 3 (Ni) | ○ | +80~+150 | 2.8 | 20300 | 118 | 18500 | 157 | metal powder |
| 69 | 20 | 80 (Ni) | 15 | — | 450 | 0.5 | 3 (Cu) | ○ | +50~+100 | 4.2 | 21000 | 110 | 19200 | 130 | electroless copper plating |
| 70 | traditional electroless nickel plating electrode | | | | | | 3 (Ni) | ○ | — | 0.7 | 17000 | 170 | 14200 | 250 | |
| 71 | traditional silver electrode of fusing type | | | | | | 5 (Ag) | — | — | 3.8 | 20600 | 115 | 18600 | 161 | |
| 72 | traditional silver electrode of fusing type | | | | | | 10 (Ag) | — | — | 4.1 | 20800 | 114 | 18600 | 158 | |
| 73 | traditional silver electrode of fusing type | | | | | | 20 (Ag) | — | — | 4.2 | 21000 | 114 | 18700 | 160 | |

What is claimed is:

1. An electrode on a heat-resisting and isolating substrate, which electrode comprises:
   a metallic particle layer of 0.2 to 1 micron in thickness comprising 5 to 60 weight % of a silver component, and 95 to 40 weight % of a base metal component containing at least one member selected from the group consisting of nickel, copper, aluminum, zinc, tin, iron and cobalt; and
   an electroless plating layer of nickel or copper of 0.5 to 20 microns in thickness;
   whereby said base metal component improves the adhesive force and electrical characteristics including dielectric constant and $\delta$ of said electrode, and prevents migration of said silver component thereby to improve the useful life of said electrode under humid conditions.

2. An electrode on a heat-resisting and isolating substrate according to claim 1, wherein said heat-resisting and isolating substrate is a ceramic substrate.

3. An electrode on a heat-resisting and isolating substrate according to claim 1, wherein said substrate is roughened by chemical and/or mechanical treatment.

4. An electrode on a heat-resisting and isolating substrate according to claim 1, wherein said base metal component is nickel.

5. An electrode on a heat-resisting and isolating substrate according to claim 1, wherein said metallic particle layer contains 0.01 to 5 weight% of a palladium component.

6. An electrode on a heat-resisting and isolating substrate according to claim 1, wherein said metallic particle layer contains a component of glass or low-melting oxide.

7. An electrode on a heat-resistng and isolating substrate according th claim 6, wherein said glass component comprises $B_2O_3$ and said low-melting oxide is $B_2O_3$.

8. An electrode on a heat-resisting and isolating substrate according to claim 1, wherein said electroless plating layer is 1 to 10 microns in thickness.

* * * * *